(12) United States Patent
Wu

(10) Patent No.: US 8,269,521 B2
(45) Date of Patent: Sep. 18, 2012

(54) MULTI-CHIP STACKED SYSTEM AND CHIP SELECT APPARATUS THEREOF

(75) Inventor: Ming-Hsueh Wu, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/018,347

(22) Filed: Jan. 31, 2011

(65) Prior Publication Data

US 2012/0126848 A1    May 24, 2012

(30) Foreign Application Priority Data

Nov. 19, 2010   (TW) .............................. 99140002 A

(51) Int. Cl.
*H03K 19/003* (2006.01)

(52) U.S. Cl. ........................................ 326/21; 438/110

(58) Field of Classification Search .................. None
See application file for complete search history.

(56) References Cited

U.S. PATENT DOCUMENTS

| | | | |
|---|---|---|---|
| 4,582,279 A * | 4/1986 | Pontier | ........................ 246/34 B |
| 6,448,661 B1 | 9/2002 | Kim et al. | |
| 7,392,354 B1 * | 6/2008 | Au et al. | ........................ 711/154 |
| 7,698,470 B2 * | 4/2010 | Ruckerbauer et al. | ........... 710/14 |
| 2005/0082664 A1 * | 4/2005 | Funaba et al. | ................. 257/724 |
| 2007/0126105 A1 | 6/2007 | Yamada et al. | |
| 2008/0111582 A1 * | 5/2008 | Matsui et al. | .................... 326/39 |
| 2009/0085608 A1 * | 4/2009 | Alzheimer | ....................... 326/86 |
| 2010/0271888 A1 * | 10/2010 | Rajan et al. | .................... 365/194 |

* cited by examiner

*Primary Examiner* — Shawki S Ismail
*Assistant Examiner* — Crystal L Hammond
(74) *Attorney, Agent, or Firm* — Jianq Chyun IP Office

(57) ABSTRACT

A multi-chip stacked system and a chip select apparatus are provided. The chip select apparatus includes n ID code generators and n activation logic units. The first ID code generator generates a first ID code and a second seed code according to a first seed code, and an $i^{th}$ ID code generator connected to the $(i-1)^{th}$ ID code generator generates an $i^{th}$ ID code and an $(i+1)^{th}$ seed code according to the $i^{th}$ seed code. The ID codes generated by the ID code generators are different to each other. Each of the activation logic units has an activation code. The $i^{th}$ activation logic unit receives the $i^{th}$ ID code from the $i^{th}$ ID code generator. The $i^{th}$ activation logic unit activates the $i^{th}$ chip when the $i^{th}$ ID code is complied with the activation code of the $i^{th}$ activation logic unit.

27 Claims, 13 Drawing Sheets

|  $C_3C_2$ | 00 | 01 | 11 | 10 |
|---|---|---|---|---|
| $C_1C_0$ | | | | |
| 00 | | | 0 | ( ) |
| 01 | | | 1 | |
| 11 | 0 | 1 | | 1 |
| 10 | | 1 | 1 | |

$C_{3\_new}$

|  $C_3C_2$ | 00 | 01 | 11 | 10 |
|---|---|---|---|---|
| $C_1C_0$ | | | | |
| 00 | | | 1 | ( ) |
| 01 | | | 0 | |
| 11 | 1 | 1 | | 0 |
| 10 | | 1 | 1 | |

$C_{2\_new}$

|  $C_3C_2$ | 00 | 01 | 11 | 10 |
|---|---|---|---|---|
| $C_1C_0$ | | | | |
| 00 | | | 1 | ( ) |
| 01 | | | 1 | |
| 11 | 1 | 1 | | 0 |
| 10 | | 0 | 0 | |

$C_{1\_new}$

|  $C_3C_2$ | 00 | 01 | 11 | 10 |
|---|---|---|---|---|
| $C_1C_0$ | | | | |
| 00 | | | 1 | ( ) |
| 01 | | | 1 | |
| 11 | 0 | 0 | | 0 |
| 10 | | 0 | 1 | |

$C_{0\_new}$

FIG. 6

|  $C_3C_2$ | 00 | 01 | 11 | 10 |
|---|---|---|---|---|
| $C_1C_0$ | | | | |
| 00 | 0 | 0 | 0 | 0 |
| 01 | 0 | 0 | 1 | 1 |
| 11 | 0 | 1 | 1 | 1 |
| 10 | 0 | 1 | 1 | 0 |

$C_{3\_new}$

| $C_3C_2$ | 00 | 01 | 11 | 10 |
|---|---|---|---|---|
| $C_1C_0$ | | | | |
| 00 | 0 | 1 | 1 | 0 |
| 01 | 0 | 0 | 0 | 0 |
| 11 | 1 | 1 | 0 | 0 |
| 10 | 1 | 1 | 1 | 0 |

$C_{2\_new}$

| $C_3C_2$ | 00 | 01 | 11 | 10 |
|---|---|---|---|---|
| $C_1C_0$ | | | | |
| 00 | 0 | 0 | 1 | 1 |
| 01 | 1 | 1 | 1 | 1 |
| 11 | 1 | 1 | 0 | 0 |
| 10 | 0 | 0 | 0 | 0 |

$C_{1\_new}$

| $C_3C_2$ | 00 | 01 | 11 | 10 |
|---|---|---|---|---|
| $C_1C_0$ | | | | |
| 00 | 0 | 0 | 1 | 0 |
| 01 | 0 | 0 | 1 | 0 |
| 11 | 0 | 0 | 1 | 0 |
| 10 | 0 | 0 | 1 | 0 |

$C_{0\_new}$

FIG. 7

MULTI-CHIP STACKED SYSTEM AND CHIP SELECT APPARATUS THEREOF

CROSS-REFERENCE TO RELATED APPLICATION

This application claims the priority benefit of Taiwan application serial no. 99140002, filed on Nov. 19, 2010. The entirety of the above-mentioned patent application is hereby incorporated by reference herein and made a part of this specification.

TECHNICAL FIELD

The disclosure relates to a multi-chip stacked system and a chip select apparatus thereof.

BACKGROUND

A three-dimensional (3D) chip integration technology can reduce a signal transmission distance and improve system performance. Regarding an electronic device having a regular structure, for example, a memory chip, a memory capacity thereof can be flexibly expanded according to an existing chip fabrication method through the 3D chip integration technology without re-planning a layout and additionally fabricating a new optical mask to meet a memory requirement of new application hardware.

The 3D chip integration technology includes two main types of a 3D packaging technique and a 3D connection technique. Regarding the 3D packaging technique, since pads are distributed around chips, the pads can be connected to a controller through wire bonding, so as to achieve a purpose of arbitrarily selecting a stacked chip. The 3D connection technique generally uses a through silicon via (TSV) connection technique. However, the pads of the TSV connection technique are distributed inside the chips, when the controller wants to control a remote chip of a non-adjacent layer, the controller has to communicate with the remote chip through the TSVs there between, so that the method of directly connecting the controller through the wire bonding approach may result in a fact that the chips closer to the controller have to spend more area on TSVs, so as to provide a communication usage for the remote chips, which may spend a great overhead for stacking the same chips.

In issued or published patents, the memory stacking techniques using the TSV connection technique are approximately divided into two main types of a decoded chip select signal and an encoded chip select signal according to control signals for chip selection. The decoded chip select signals are generated by the controller, and a plurality of the generated select signals is transmitted to the chip of each layer n a one-to-one mode, so that a number of the select signals represent a maximum number of the memory chips capable of being stacked. Regarding the encoded chip select signal, the encoded select signal is generated by the controller, and the same select signal is transmitted to the chip of each layer through the TSVs. The chip of each layer compares the select signal with a unique identification (ID) code defined in the chip to determine whether or not to activate a related operation. After the chip stacking is completed, the ID codes are unchangeable, while the select signal is changeable. For example, a first ID code is built in a first chip, and a second ID code is built in a second chip, where the first ID code is different to the second ID code. The controller generates the select signal to the first chip and the second chip, where if the select signal is complied with the first ID code, the first chip is activated, and if the select signal is complied with the second ID code, the second chip is activated.

However, in the conventional technique, some processes are required to make all identical chips to be identifiable to each other (for example, a fuse-programmable method is used to program the unique ID code in the identical chip of each layer), so that cost of staking the chips is increased. Alternatively, a logic circuit is used to generate the unique code for each of the stacked chips for comparing with the select signal, though according to such method, hardware cost is still increased. For example, regarding 3D memory stacking using the TSV connection technique, the memory chip of each layer has completely identical circuit structure, layout and connection, so that positions of the TSVs of the memory chip of each layer are identical. Therefore, how to generate logic differences capable of being identified for the 3D memory stacking is an issue to be developed in the 3D stacking technique for various manufactures.

SUMMARY

The disclosure provides an exemplary embodiment of a chip select apparatus for controlling n stacked chips identical to each other, where n is an integer. The chip select apparatus includes n identification (ID) code generators and n activation logic units. An $i^{th}$ ID code generator in the ID code generators is disposed in an $i^{th}$ chip of the chips, where i is an integer between 1 and n. A first ID code generator of the ID code generators receives a first seed code, and generates a first ID code and a second seed code according to the first seed code, and an $i^{th}$ ID code generator is electrically connected to an $(i-1)^{th}$ ID code generator to receive an $i^{th}$ seed code, and generates an $i^{th}$ ID code and an $(i+1)^{th}$ seed code according to the $i^{th}$ seed code. All of the ID codes generated by the ID code generators are different to each other. Each of the activation logic units has an activation code. An $i^{th}$ activation logic unit in the activation logic units is disposed in the $i^{th}$ chip of the chips. The $i^{th}$ activation logic unit is electrically connected to the $i^{th}$ ID code generator for receiving the $i^{th}$ ID code. The $i^{th}$ activation logic unit activates the $i^{th}$ chip when the $i^{th}$ ID code received by the $i^{th}$ activation logic unit is complied with the activation code.

The disclosure provides an exemplary embodiment of a multi-chip stacked system including a chip controller, n chips identical to each other, n identification (ID) code generators and n activation logic units, where n is an integer. An $i^{th}$ ID code generator in the ID code generators is disposed in an $i^{th}$ chip of the chips, where i is an integer between 1 and n. A first ID code generator of the ID code generators receives a first seed code, and generates a first ID code and a second seed code according to the first seed code, and an $i^{th}$ ID code generator is electrically connected to an $(i-1)^{th}$ ID code generator to receive an $i^{th}$ seed code, and generates an $i^{th}$ ID code and an $(i+1)^{th}$ seed code according to the $i^{th}$ seed code. All of the n ID codes are different to each other. Each of the activation logic units has an activation code. An $i^{th}$ activation logic unit in the activation logic units is disposed in the $i^{th}$ chip. The $i^{th}$ activation logic unit is electrically connected to the $i^{th}$ ID code generator for receiving the $i^{th}$ ID code. The $i^{th}$ activation logic unit activates the $i^{th}$ chip when the $i^{th}$ ID code received by the $i^{th}$ activation logic unit is complied with the activation code of the $i^{th}$ activation logic unit. The chip controller is electrically connected to the first ID code generator in the ID code generators for supplying the first seed code.

According to the above descriptions, the activation code is built in each of a plurality of the same chips. The ID code generators in the chips are connected in series, for example, the first ID code generator of the first chip is connected in series to the second ID code generator of the second chip. The ID code generator of each stage generates the corresponding ID code according to the seed code output by the ID code generator of the previous stage, for example, the second ID code generator generates the second ID code according to the second seed code output by the first ID code generator. When the ID code generated by the ID code generator in one of the chips is complied with the inbuilt activation code, such chip is activated.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain the principles of the invention.

FIG. 6 and FIG. 7 are Karnaugh maps of an ID code generator of FIG. 1 according to an exemplary embodiment.

DETAILED DESCRIPTION OF DISCLOSED EMBODIMENTS

A plurality of chips mentioned in following exemplary embodiments are, for example, chips with the same optical mask and the same fabrication process, and the chips are mutually stacked according to a three-dimensional (3D) chip integration technology to form a 3D stacking.

Taking a 3D memory stacking as an example, regarding the 3D memory stacking using a through silicon via (TSV) connection technique, since the memory chip of each layer has identical circuit structure, layout and connection during stacking, positions of the TSVs of the memory chip of each layer are also identical. Moreover, an activation code built in an activation logic unit of the memory chip of each layer is also the same. The chip select apparatus in multiple chips provided by the exemplary embodiment of the disclosure may have the identical circuit structure, layout and connection. In the disclosure, by determining a first seed code, the outputs of the chip select apparatus connected in series may generate logic differences enough for identification, so that selection and control of the multiple chips can be implemented. However, implementation of the disclosure is not limited to the memory chips. In other embodiments, the multiple chips can also be other types of chips such as logic circuits, etc., and these different implementations are all within the application scope of the disclosure.

Figure 1:
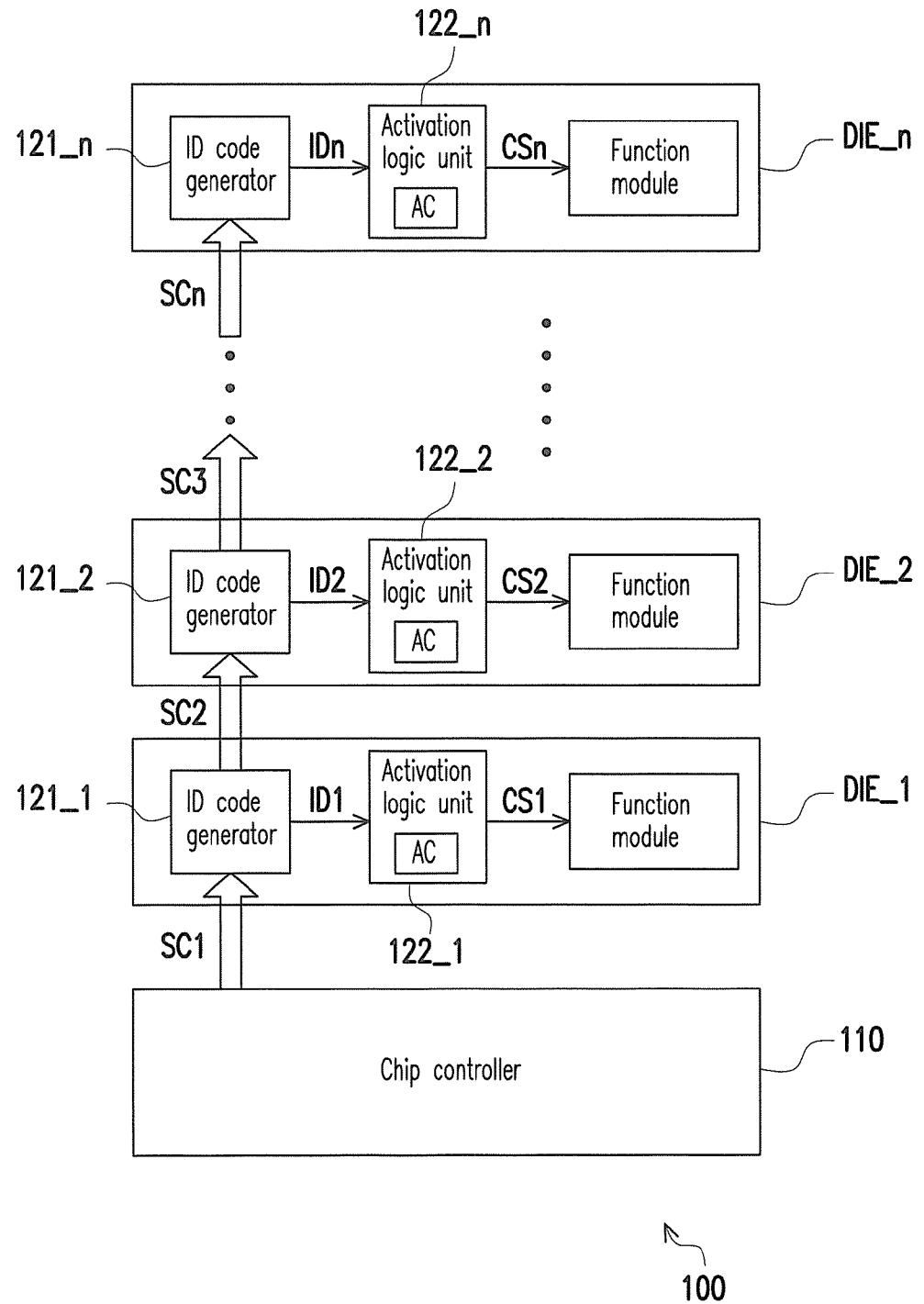
FIG. 1 is a functional block schematic diagram of a multi-chip stacked system according to an exemplary embodiment.

FIG. 1 is a functional block schematic diagram of a multi-chip stacked system according to an exemplary embodiment. The multi-chip stacked system 100 includes a chip controller 110 and n chips (for example, a first chip DIE_1, a second chip DIE_2 and an $n^{th}$ chip DIE_n), where n is any integer of 2, 3, or 4, etc. The chips can be electrically connected to each other through TSVs and conductive bumps.

In the present exemplary embodiment, the chips DIE_1-DIE_n respectively have a function module. These function modules have an identical circuit structure, for example, memory modules or other types of chips. For simplicity's sake, besides chip select signals CS1, CS2, . . . , CSn, related signal paths of these function modules are not illustrated in FIG. 1. Through control of the chip select signals CS1-CSn, the chips DIE_1-DIE_n can be activated. For example, the first chip select signal CS1 determines whether or not to activate the function module of the first chip DIE_1.

A chip select apparatus of the multi-chip stacked system 100 includes n identification (ID) code generators (for example, a first ID code generator 121_1, a second ID code generator 121_2 and an $n^{th}$ ID code generator 121_n), and n activation logic units (for example, a first activation logic unit 122_1, a second activation logic unit 122_2 and an $n^{th}$ activation logic unit 122_n). An $i^{th}$ ID code generator 121_i and an $i^{th}$ activation logic unit 122_i are disposed in an $i^{th}$ chip DIE_i of the chips DIE_1-DIE_n, where i is an integer between 1 and n. For example, the first ID code generator 121_1 and the first activation logic unit 122_1 are disposed in the first chip DIE_1, the second ID code generator 121_2 and the second activation logic unit 122_2 are disposed in the second chip DIE_2, and the $n^{th}$ ID code generator 121_n and the $n^{th}$ activation logic unit 122_n are disposed in the $n^{th}$ chip DIE_n. Implementations of the first chip DIE_1 and the second chip DIE_2 are described below, and implementations of the other chips (for example the $n^{th}$ chip DIE_n) can be deduced by analogy.

The first ID code generator 121_1 in the ID code generators 121_1-121_n receives a first seed code SC1, and generates a first ID code ID1 and a second seed code SC2 according to the first seed code SC1. The $i^{th}$ ID code generator 121_i is electrically connected to an $(i-1)^{th}$ ID code generator 121_(i−1) to receive an $i^{th}$ seed code SCi, and generates an $i^{th}$ ID code IDi and an $(i+1)^{th}$ seed code SC(i+1) according to the $i^{th}$ seed code SCi, where the first ID code ID1 to an $n^{th}$ ID code IDn are different to each other. For example, the second ID code generator 121_2 is electrically connected to the first ID code generator 121_1 for receiving the second seed code SC2, and generates a second ID code ID2 and a third seed code SC3 according to the second seed code SC2. The chip controller 110 is electrically connected to the first ID code generator 121_1 for supplying the first seed code SC1. The first ID code generator 121_1 generates the first ID code ID1 and the second seed code SC2 according to the first seed code SC1.

An activation code AC is built in each of the activation logic units 122_1-122_n, and the activation codes AC of the activation logic units 122_1-122_n are the same. The $i^{th}$ activation logic unit 122_i can be implemented through any method, for example, a logic circuit such as a decoder or a comparator, etc., so as to decode and compare whether the received $i^{th}$ ID code IDi is complied with the internal activation code AC, for example, whether all of or a part of code bits are the same. After the chip stacking is completed, the activation code AC is unchangeable, while the ID codes ID1-IDn are changeable. The $i^{th}$ activation logic unit 122_i in the activation logic units 122_1-122_n is disposed in the $i^{th}$ chip DIE_i of the chips DIE_1-DIE_n, and the $i^{th}$ activation logic unit 122_i is electrically connected to the $i^{th}$ ID code generator 121_i for receiving the $i^{th}$ ID code IDi. The $i^{th}$ activation logic unit 122_i activates the $i^{th}$ chip DIE_i when the $i^{th}$ ID code IDi received by the $i^{th}$ activation logic unit 122_i is complied with the inbuilt activation code AC.

For example, the first activation logic unit 122_1 is electrically connected to the first ID code generator 121_1 for receiving the first ID code ID1. The activation code AC is built in the first activation logic unit 122_1. When the first ID code ID1 received by the first activation logic unit 122_1 is complied with the activation code AC, the first activation logic unit 122_1 outputs the chip select signal CS1 to activate the function module of the first chip DIE_1.

The second ID code generator 121_2 is electrically connected to the first ID code generator 121_1 for receiving the second seed code SC2, and generates the second ID code ID2 according to the second seed code SC2, where the first ID code ID1 is different to the second ID code ID2. Moreover, the second ID code generator 121_2 generates the third seed code SC3 to the ID code generator of a next chip according to the second seed code SC2. The second activation logic unit 122_2 is electrically connected to the second ID code generator 121_2 for receiving the second ID code ID2. The second activation logic unit 122_2 has the activation code AC the same to that of the first activation logic unit 122_1. Implementation of the second activation logic unit 122_2 is the same to that of the first activation logic unit 122_1. When the second ID code ID2 received by the second activation logic unit 122_2 is complied with the inbuilt activation code AC, the second activation logic unit 122_2 outputs the chip select signal CS2 to activate the function module of the second chip DIE_2.

Deduced by analogy, an $n^{th}$ ID code generator 121_n receives the $n^{th}$ seed code SCn provided by the ID code generator of the previous chip, and generates the $n^{th}$ ID code IDn to the $n^{th}$ activation logic unit 122_n according to the $n^{th}$ seed code SCn, where the $n^{th}$ ID code IDn is different to the first ID code ID1 and the second ID code ID2. The $n^{th}$ activation logic unit 122_n also has the same activation code AC. When the $n^{th}$ ID code IDn received by the $n^{th}$ activation logic unit 122_n is complied with the activation code AC, the $n^{th}$ activation logic unit 122_n outputs the chip select signal CSn to activate the function module of the $n^{th}$ chip DIE_n.

In some embodiments, the first ID code generator 121_1 transmits the first seed code SC1 to the first activation logic unit 122_1 to serve as the first ID code ID1, and generates the second seed code SC2 to the second ID code generator 121_2 according to the first seed code SC1. The second ID code generator 121_2 transmits the second seed code SC2 to the second activation logic unit 122_2 to serve as the second ID code ID2, and generates the third seed code SC3 to the ID code generator of the next chip according to the second seed code SC2. Deduced by analogy, the $n^{th}$ ID code generator 121_n transmits the $n^{th}$ seed code SCn provided by the ID code generator of the previous chip to the $n^{th}$ activation logic unit 122_n to serve as the $n^{th}$ ID code IDn.

Therefore, the $i^{th}$ ID code IDi is an $i^{th}$ value Vi and an $(i+1)^{th}$ ID code ID(i+1) is an $(i+1)^{th}$ value V(i+1) when the $i^{th}$ seed code SCi is the $i^{th}$ value Vi. The $i^{th}$ ID code IDi is the $(i+1)^{th}$ value V(i+1) and the $(i+1)^{th}$ ID code ID(i+1) is an $(i+2)^{th}$ value V(i+2) when the $i^{th}$ seed code SCi is the $(i+1)^{th}$ value V(i+1). The $i^{th}$ ID code IDi is the $(i+2)^{th}$ value V(i+2) and the $(i+1)^{th}$ ID code ID(i+1) is an $(i+3)^{th}$ value V(i+3) when the $i^{th}$ seed code SCi is the $(i+2)^{th}$ value V(i+2). The activation code AC is the $n^{th}$ value or the $(n+1)^{th}$ value. For example, taking the two-layer stacked first chip DIE_1 and second chip DIE_2 as an example, when the first seed code SC1 is a first value V1, the first ID code ID1 is the first value V1 and the second ID code ID2 is a second value V2. When the first seed code SC1 is the second value V2, the first ID code IDi is the second value V2 and the second ID code ID2 is a third value V3. When the first seed code. SC1 is the third value V3, the first ID code ID1 is the third value V3 and the second ID code ID2 is a fourth value V4. The activation code AC can be defined as the second value V2 or the third value V3 according to an actual design requirement. For example, the activation code AC is defined as the third value V3. If the second chip DIE_2 is to be activated, the chip controller 110 outputs the second value V2 to the first ID code generator 121_1 to serve as the first seed code SC1. If the first chip DIE_1 is to be activated, the chip controller 110 outputs the third value V3 to the first ID code generator 121_1 to serve as the first seed code SC1. If the first chip DIE_1 and the second chip DIE_2 are not to be activated, the chip controller 110 outputs the first value V1 to the first ID code generator 121_1 to serve as the first seed code SC1.

In some other embodiments, the first ID code generator 121_1 generates the first ID code ID1 to the first activation logic unit 122_1 according to the first seed code SC1, and outputs the first ID code IDi to the second ID code generator 121_2 to serve as the second seed code SC2. The second ID code generator 121_2 generates the second ID code ID2 to the second activation logic unit 122_2 according to the second seed code SC2, and outputs the second ID code ID2 to the ID code generator of the next chip to serve as the third seed code SC3. Deduced by analogy, the $n^{th}$ ID code generator 121_n generates the $n^{th}$ ID code IDn to the $n^{th}$ activation logic unit 122_n according to the $n^{th}$ seed code SCn.

Therefore, the $i^{th}$ ID code IDi is the $(i+1)^{th}$ value V(i+1) and the $(i+1)^{th}$ ID code ID(i+1) is the $(i+2)^{th}$ value V(i+2) when the $i^{th}$ seed code SCi is the $i^{th}$ value Vi. The $i^{th}$ ID code IDi is the $(i+2)^{th}$ value V(i+2) and the $(i+1)^{th}$ ID code ID(i+1) is the $(i+3)^{th}$ value V(i+3) when the $i^{th}$ seed code SCi is the $(i+1)^{th}$ value V(i+1). The $i^{th}$ ID code IDi is the $(i+3)^{th}$ value V(i+3) and the $(i+1)^{th}$ ID code ID(i+1) is an $(i+4)^{th}$ value V(i+4) when the $i^{th}$ seed code SCi is the $(i+2)^{th}$ value V(i+2). The activation code is the $(n+1)^{th}$ value or the $(n+2)^{th}$ value. For example, taking the two-layer stacked first chip DIE_1 and second chip DIE_2 as an example, when the first seed code SC1 is the first value V1, the first ID code ID1 is the second value V2 and the second ID code ID2 is the value V3. When the first seed code SC1 is the second value V2, the first ID code ID1 is the third value V3 and the second ID code ID2 is a fourth value V4. When the first seed code SC1 is the third value V3, the first ID code ID1 is the fourth value V4 and the second ID code ID2 is a fifth value V5. The activation code AC can be defined as the third value V3 or the fourth value V4 according to an actual design requirement. For example, the activation code AC is defined as the fourth value V4. If the second chip DIE_2 is to be activated, the chip controller 110 outputs the second value V2 to the first ID code generator 121_1 to serve as the first seed code SC1. If the first chip DIE_1 is to be activated, the chip controller 110 outputs the third value V3 to the first ID code generator 121_1 to serve as the first seed code SC1. If the first chip DIE_1 and the second chip DIE_2 are not to be activated, the chip controller 110 outputs the first value V1 to the first ID code generator 121_1 to serve as the first seed code SC1.

In the present exemplary embodiment, the ID code generators 121_1-121_n are only required to have the above functions, and implementations of the ID code generators 121_1-121_n are not limited. For example, the ID code generators 121_1-121_n can be cyclic code generators or combinational logic circuits. Since the circuit structures of the ID code generators 121_1-121_n are the same, in some embodiments requiring the same circuit design and the same layout structure of the chips DIE_1-DIE_n, the combinational logic circuit of a linear feedback shift register (LFSR) can be used to implement the ID code generator, for example, in the 3D memory stacking, the ID code generators 121_1-121_n have the same circuit structure. Detailed implementations of the ID code generators 121_1-121_n and the activation logic units 122_1-122_n are described below.

The ID code generators 121_1-121_n of the 3D stacked semiconductor chips of the present exemplary embodiment apply an operation principle of the cyclic code generator, by which temporal state variations of the cyclic code generators are converted into a spatial logic sequence achieved by the combinational logic circuits. The ID code generators 121_1-121_n having the same structure are respectively implemented in each of the 3D stacked semiconductor chips DIE_1-DIE_n. As shown in FIG. 1, when the chips are stacked, the ID code generators 121_1-121_n are connected in series according to a chip stacking sequence. The stacked semiconductor chip DIE_1 closest to the chip controller 110 receives the first seed code SC1 from the chip controller 110. The ID code generator of each layer generates a new ID code according to the ID code generated by the chip of a previous adjacent layer, and transmits the new ID code to the chip of a next adjacent layer. Therefore, the ID code of the stacked chip of each layer can be changed according to the first seed code SC1.

Figure 2A:
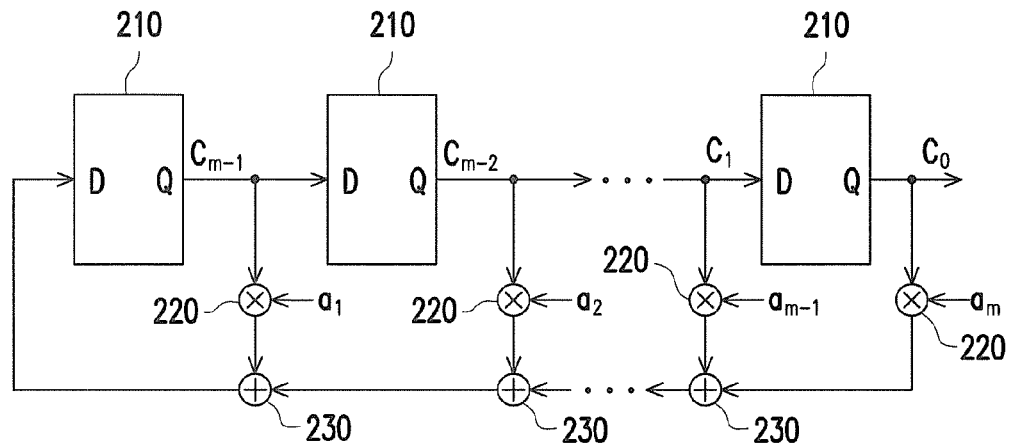
FIG. 2A and FIG. 2B are schematic diagrams illustrating a linear feedback shift register (LFSR) circuit according to another exemplary embodiment.
Figure 2B:
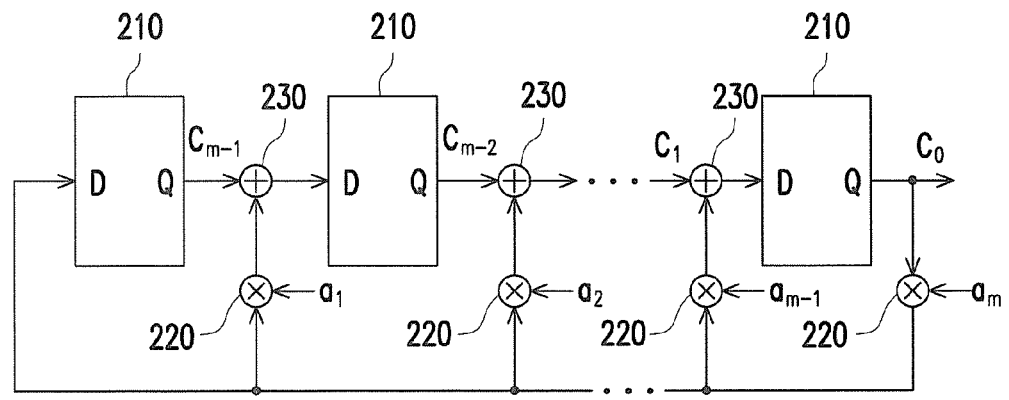

In the present embodiment, a design concept of the ID code generators 121_1-121_n comes from the widely used LFSR circuit. The LFSR circuit is a sequential circuit with a very simple structure. FIG. 2A and FIG. 2B are schematic diagrams illustrating a LFSR circuit according to another exemplary embodiment of the disclosure. There are two types of the LFSR circuit, which are respectively a Fibonacci LFSR shown in FIG. 2A and a Galois LFSR shown in FIG. 2B. According to FIG. 2A and FIG. 2B, the LFSR circuit only includes flip-flops 210, multipliers 220 and exclusive-OR (XOR) gates 230. Generally, a polynomial of $1+a_1x^1+a_2x^2+ \ldots +a_mx^m$ can be used to represent the LFSR circuit structure shown in FIG. 2A or FIG. 2B, where m represents a bit number used by the LFSR, and values of coefficients $a_1, a_2, \ldots, a_m$ are 0 or 1. Therefore, when the coefficient $a_k$ (k=1, 2, ..., or m)=1, it represents that the corresponding multiplier can be simplified, and when the coefficient $a_k$=0, it represents that the corresponding multiplier and XOR gate can be simplified.

Figure 2C:
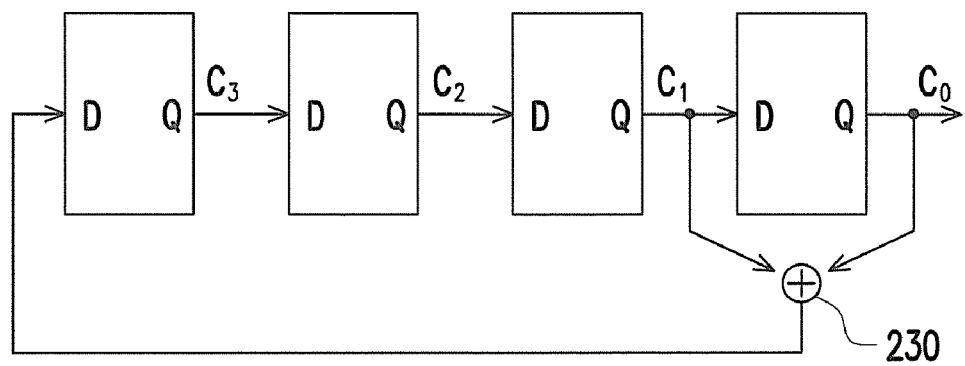
FIG. 2C is a schematic diagram of a Fibonacci LFSR sequential circuit of $1+x^3+x^4$ according to an exemplary embodiment of the disclosure.

For example, FIG. 2C is a schematic diagram of a Fibonacci LFSR sequential circuit of $1+x^3+x^4$. The LFSR circuit shown in FIG. 2C is a combinational logic circuit without memory units (for example, the flip-flops), which can be used to implement the ID code generator (for example, 121_1, 121_2 and 121_n) of FIG. 1. The LFSR circuit of FIG. 2C includes a four-bit shifter and the XOR gate 230.

Figure 3:
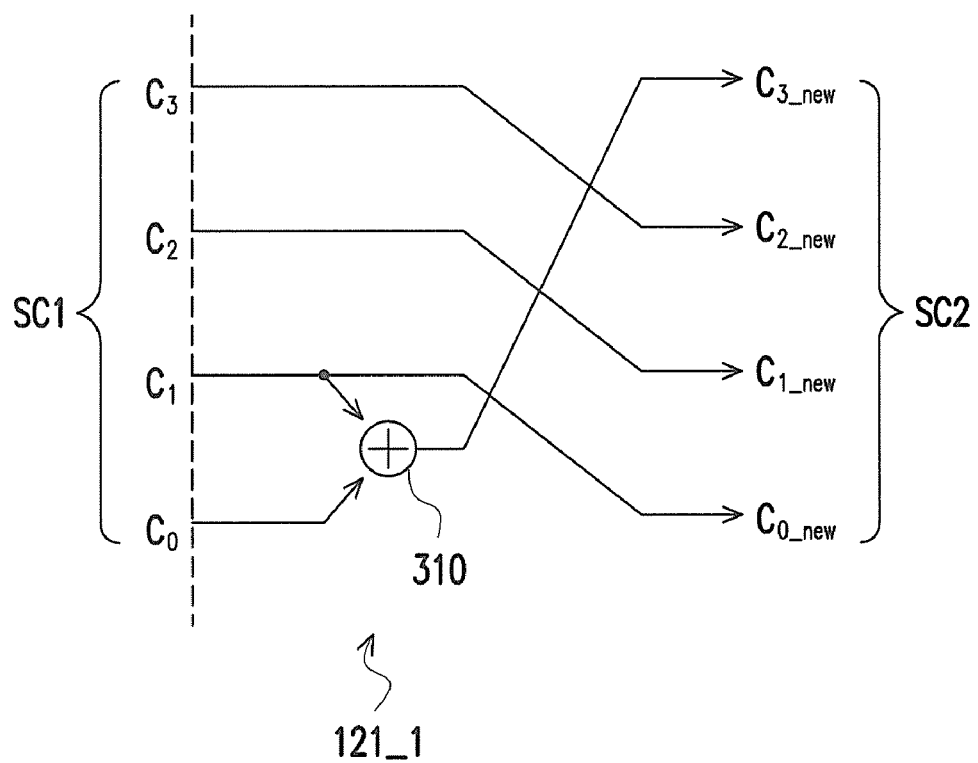
FIG. 3 is a circuit schematic diagram of an ID code generator 121_1 of FIG. 1 according to an exemplary embodiment.
Figure 4:
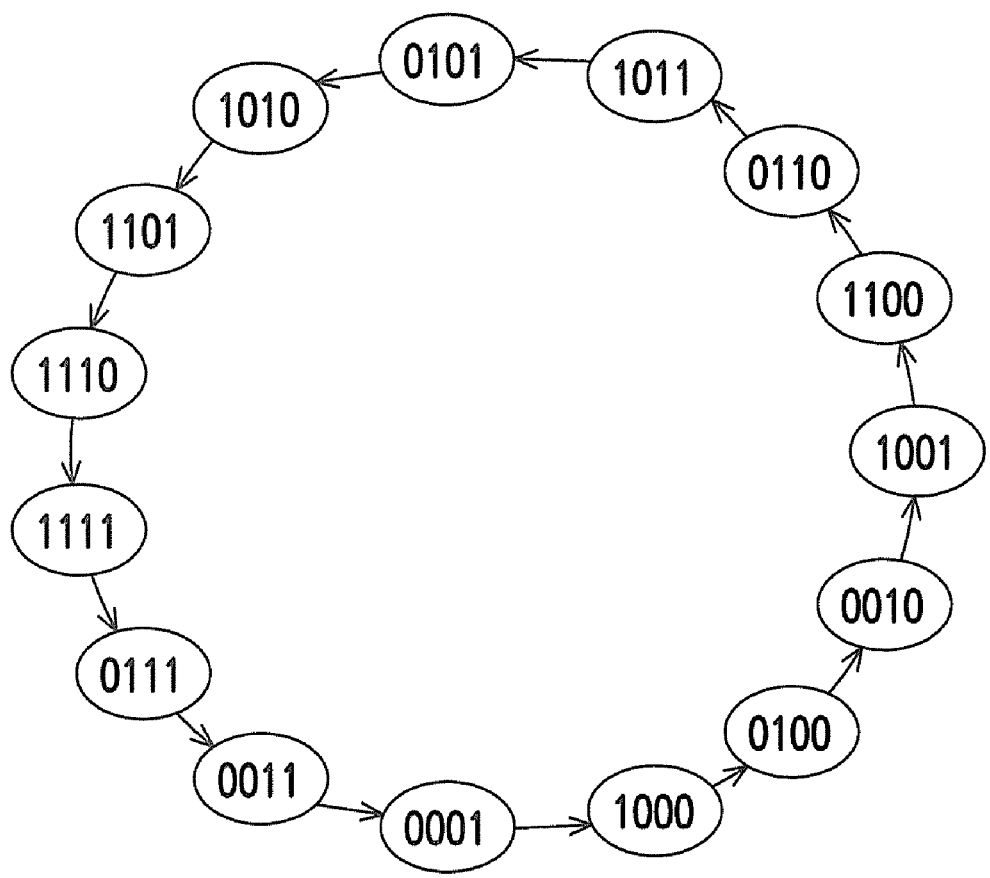
FIG. 4 is a state diagram of an ID code generator of FIG. 3.

Taking the ID code generator 121_1 of FIG. 1 as an example, an implementation of the ID code generator 121_1 is as that shown in FIG. 3. FIG. 3 is a circuit schematic diagram of the ID code generator 121_1 of FIG. 1 according to an exemplary embodiment, i.e. a schematic diagram of the ID code generator 121_1 implemented by a LFSR circuit of $1+x^3+x^4$. The first seed code SC1 includes bits of $C_3, C_2, C_1$ and $C_0$, and the second seed code SC2 includes bits of $C_{3\_new}, C_{2\_new}, C_{1\_new}$ and $C_{0\_new}$. In FIG. 3, the bits of $C_3, C_2$ and $C_1$ are respectively shifted to the bits of $C_{2\_new}, C_{1\_new}$ and $C_{0\_new}$, which is the so-called routing shift, and is equivalent to an operation of a shifter formed by the flip-flops of FIG. 2C. An XOR gate 310 of FIG. 3 is equivalent to the XOR gate 230 of FIG. 2C. Implementations of the other ID code generators (for example, 121_2 and 121_n) are similar to that of the ID code generator 121_1. FIG. 4 is a state diagram of the ID code generator 121_1 of FIG. 3. For example, when the first seed code SC1 is "0101", the second seed code SC2 generated by the ID code generator 121_1 is "1010". The ID code generator 121_1 can output the first seed code SC1 or the second seed code SC2 to the activation logic unit 122_1 to serve as the first ID code ID1.

Figure 5:
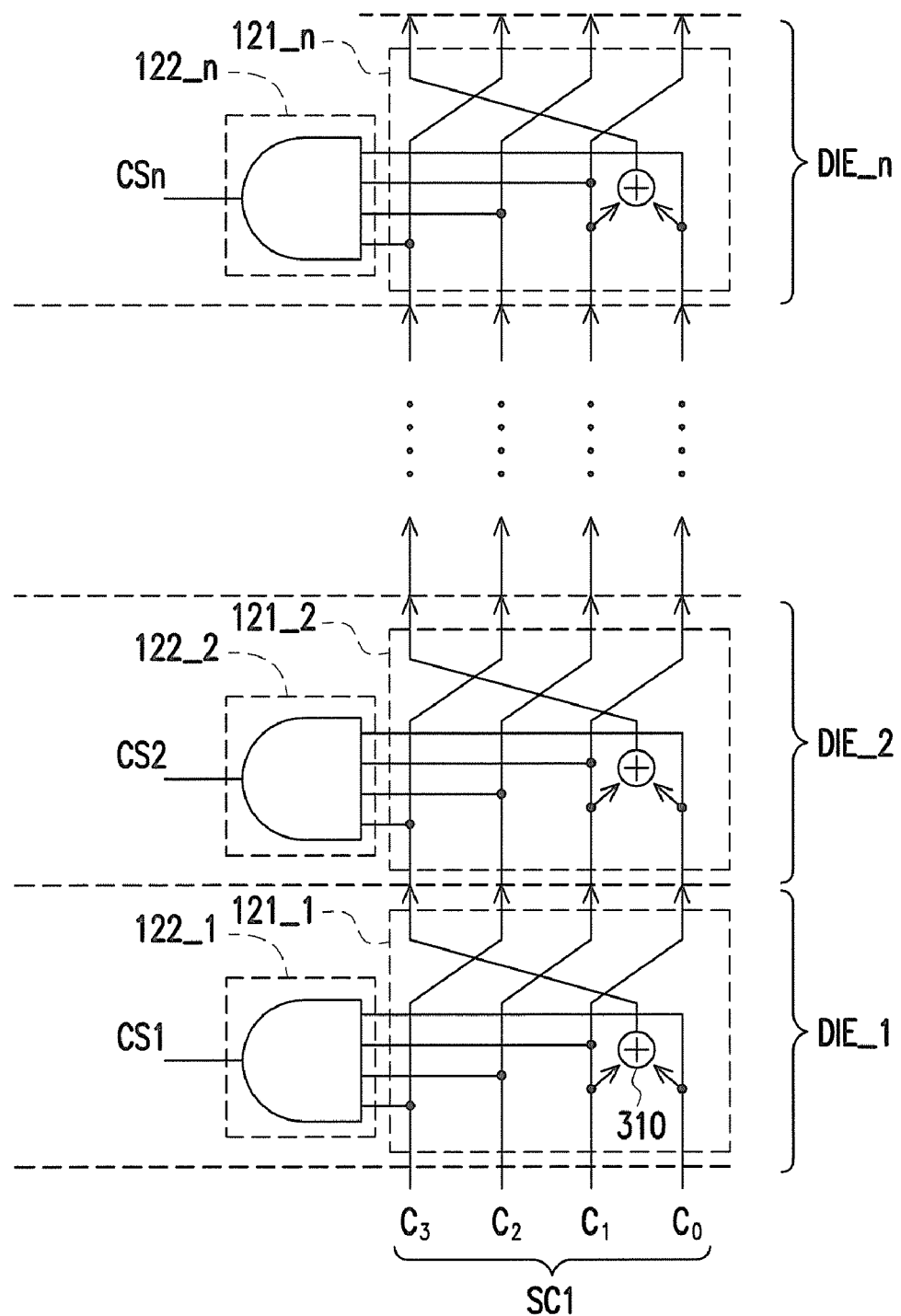
FIG. 5 is a circuit schematic diagram of a chip select apparatus of FIG. 1 according to an exemplary embodiment.

FIG. 5 is a circuit schematic diagram of a chip select apparatus of FIG. 1 according to an exemplary embodiment. In the present exemplary embodiment, implementations of the ID code generators 121_1-121_n are the same as that described in FIG. 3. Each of the activation logic units 122_1-122_n is implemented by an AND gate with four inputs. As shown in FIG. 5, the output of the AND gate is 1 only when the four inputs are all logic 1. Therefore, the activation code AC built in each of the activation logic units 122_1-122_n is "1111". Certainly, the activation code AC can also be defined as other values according to instructions of the disclosure. In the present exemplary embodiment, if the second chip DIE_2 is to be activated, the chip controller 110 outputs "1110" to the first ID code generator 121_1 to serve as the first seed code SC1. If the first chip DIE_1 is to be activated, the chip controller 110 outputs "1111" to the first ID code generator 121_1 to serve as the first seed code SC1. If all of the chips DIE_1-DIE_n are not to be activated, the chip controller 110 can output a disable code "0000" to the first ID code generator 121_1 to serve as the first seed code SC1. Therefore, a chip selection effect can be achieved according to the present exemplary embodiment.

Figure 5A:
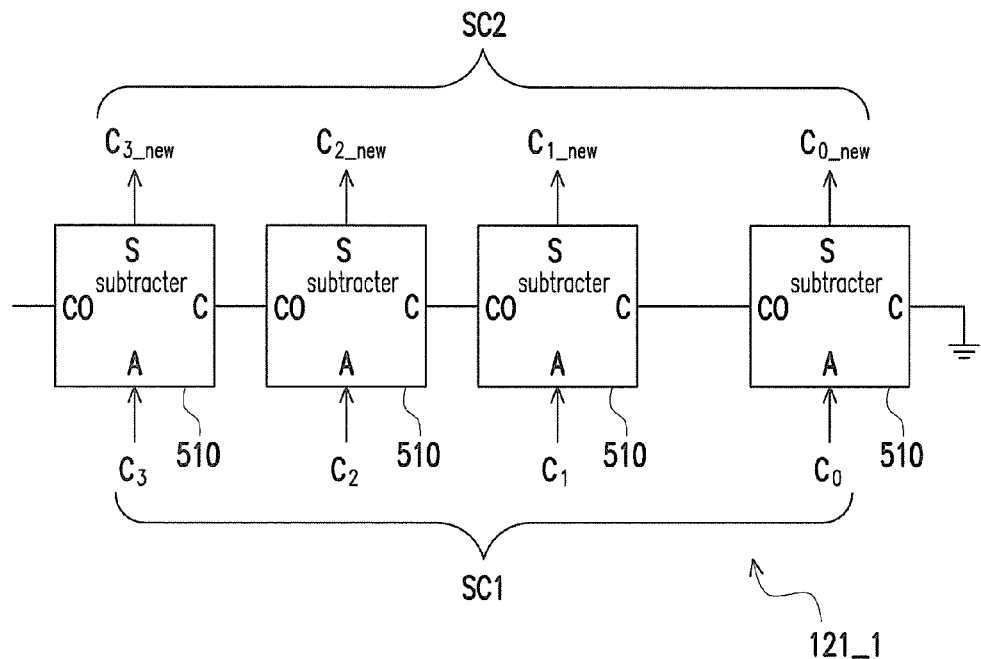
FIG. 5A is a circuit schematic diagram of an ID code generator of FIG. 1 according to another exemplary embodiment of the disclosure.
Figure 5B:
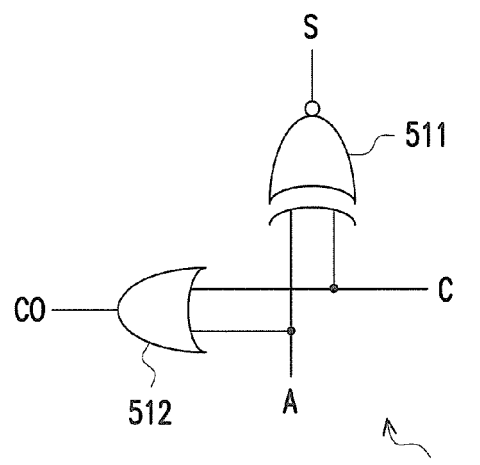
FIG. 5B is a circuit schematic diagram of a single-bit subtracter of FIG. 5A according to an exemplary embodiment.

Besides the cyclic code generator, the ID code generators 121_1-121_n of the aforementioned exemplary embodiment can also be implemented through other methods. For example, FIG. 5A is a circuit schematic diagram of the ID code generator 121_1 of FIG. 1 according to another exemplary embodiment. Implementations of the other ID code generators 121_2-121_n can be the same as that shown in FIG. 5A. In the present exemplary embodiment, the ID code generator 121_1 includes four minus-one subtracters 510. Each of the minus-one subtracters 510 has a carry input terminal C, a carry output terminal CO, a data input terminal A and a data output terminal S. The chips DIE1-DIE16 stacked by 16 layers may use the 4-bit minus-one subtracters of FIG. 5A as the ID code generator 121_1. FIG. 5B is a circuit schematic diagram of a single-bit subtracter of FIG. 5A according to an exemplary embodiment. The subtracter 510 includes an XNOR gate 511 and an OR gate 512. Two input terminals of the XNOR gate 511 are respectively coupled to the data input terminal A and the carry input terminal C of the subtracter 510. An output terminal of the XNOR gate 511 is coupled to the data output terminal S of the subtracter 510. Two input terminals of the OR gate 512 are respectively coupled to the data input terminal A and the carry input terminal C of the subtracter 510. An output terminal of the OR gate 512 is coupled to the carry output terminal CO of the subtracter 510. When the seed code SC1 of the input terminal of the ID code generator 121_1 is used as the ID code ID1 of the chip DIE_1, the activation code AC is 0000. When the seed code SC2 of the output terminal of the ID code generator 121_1 is used as the ID code ID1 of the chip DIE_1, the activation code AC is 1111.

Moreover, a design method of a general combinational logic circuit can also be used to design the ID code generator. In the present exemplary embodiment, a design flow of the combinational logic circuit is as follows.

A set of n different effective seed codes SC1', SC2', ..., SCn' using m bits is defined for n-layer semiconductor chips, where m and n satisfy a condition of $2^m \geq n$, and the remained $2^m - n$ unused codes are ineffective seed codes.

A seed code conversion table is designed according to the defined seed codes, as that shown in a table 1. Besides the seed code SC1', the other effective seed codes can only be obtained through conversion of a single effective seed code. The seed code SCk' of the table 1 can be an ineffective seed code or the seed code SC1'. If the seed code SCk' is the ineffective seed code, it should be noticed that the ineffective seed code cannot be converted into the effective seed code.

According to the seed code conversion table, a Karnaugh map is used to design the combinational logic circuit of the ID code generator.

TABLE 1 seed code conversion table

| Input seed code | Output seed code |
|---|---|
| SC1' | SC2' |
| SC2' | SC3' |
| ... | ... |
| SCn' | SCk' |

The seed code SCn' of the table 1 can be the activation code AC. If the seed code SCk' is equal to the seed code SC1', and there is no disable code, a disable signal has to be additionally used to achieve a purpose of not selecting any chip. If the ineffective seed code is additionally defined as the disable code, usage of the disable signal is unnecessary, and chip controller 110 can provide the disable code through the first seed code SC1 to achieve the purpose of not selecting any chip.

Taking the ID code generator 121_1 of FIG. 1 as an example, and implementations of the other ID code generators (for example, 121_2 and 121_n) can be the same as that of the ID code generator 121_1. A seed code of four bits is taken as an example for description, i.e. the input first seed code SC1 includes bits of $C_3$, $C_2$, $C_1$ and $C_0$, and the output second seed code SC2 includes bits of $C_{3\_new}$, $C_{2\_new}$, $C_{1\_new}$ and $C_{0\_new}$. Here, the ID code generator uses the disable code, and at most 8 layers of the chips can be stacked. It is assumed that the effective seed codes SC1', SC2', SC3', SC4', SC5', SC6', SC7' and SC8' are respectively defined as "0011", "0110", "1100", "0111", "1110", "1101", "1011", and "1000", and the activation code is defined as "1000". Therefore, the activation logic units 122_1-122_n may use AND gates having three inverting input terminals and one non-inverting input terminal. The defined effective seed codes are input into the table 1, a preliminary Kanaugh map is obtained, as that shown in FIG. 6. Regarding blank boxes of FIG. 6, besides the dot line circle represents the activation code AC, the others represent ineffective seed codes "0000", "0001", "0010", "0101", "1001", "1010" and "1111". For logic simplicity, the dot line circuit of FIG. 6 can be filled with "0011" or the ineffective seed code according to the aforementioned seed code conversion rule, and the other blank boxes can only be filled with ineffective seed codes. For example, the Karnaugh map of FIG. 7, after the simplification, $C_{3\_new} = C_3C_0 + C_2C_1$, $C_{2\_new} = C_3C_1' + C_2'C_0$, $C_{1\_new} = C_3'C_1 + C_2C_1'$, $C_{0\_new} = C_1C_0$.

Figure 8:
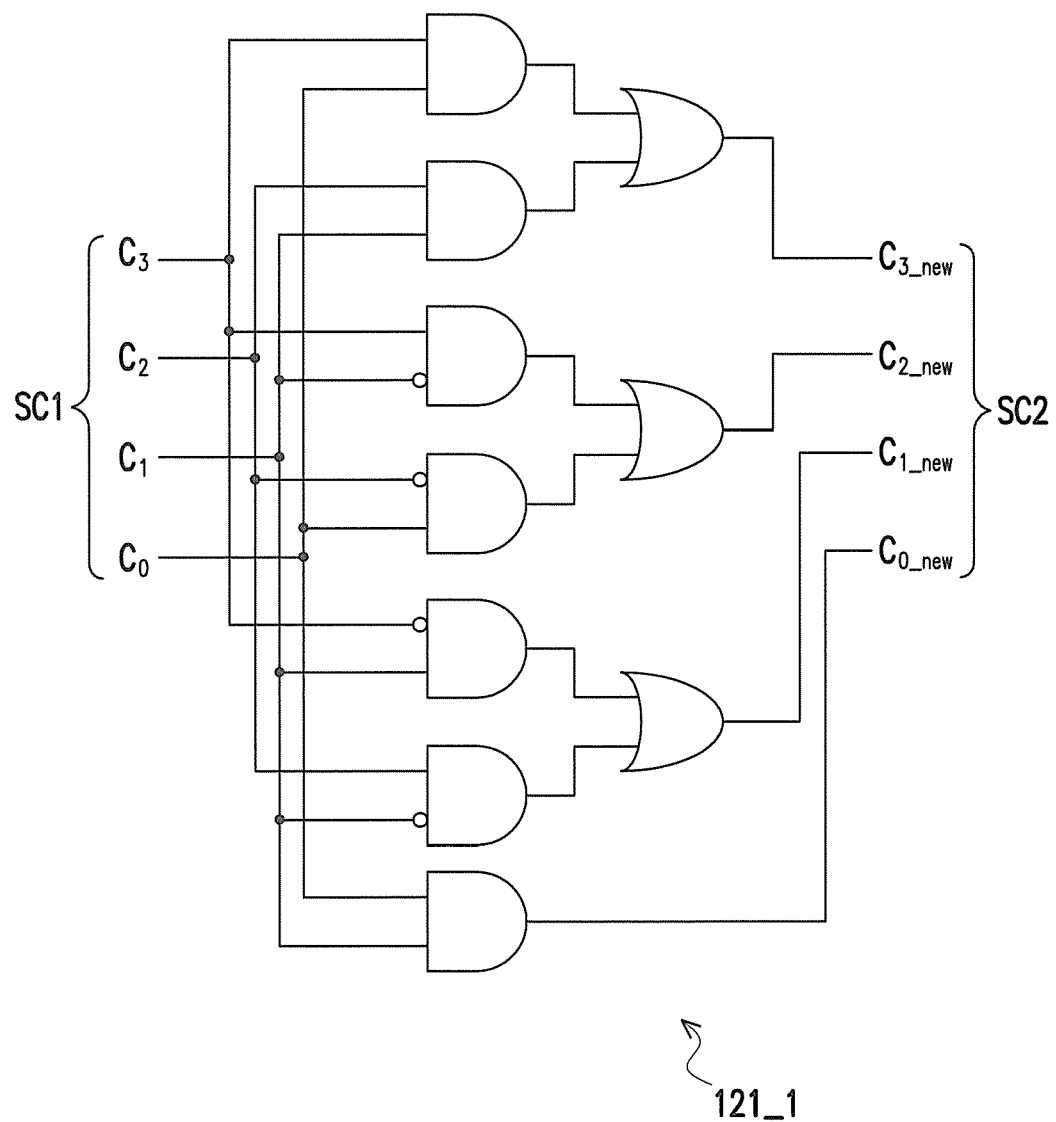
FIG. 8 is a circuit schematic diagram of the ID code generator 121_1 of FIG. 1 according to another exemplary embodiment.
Figure 9:
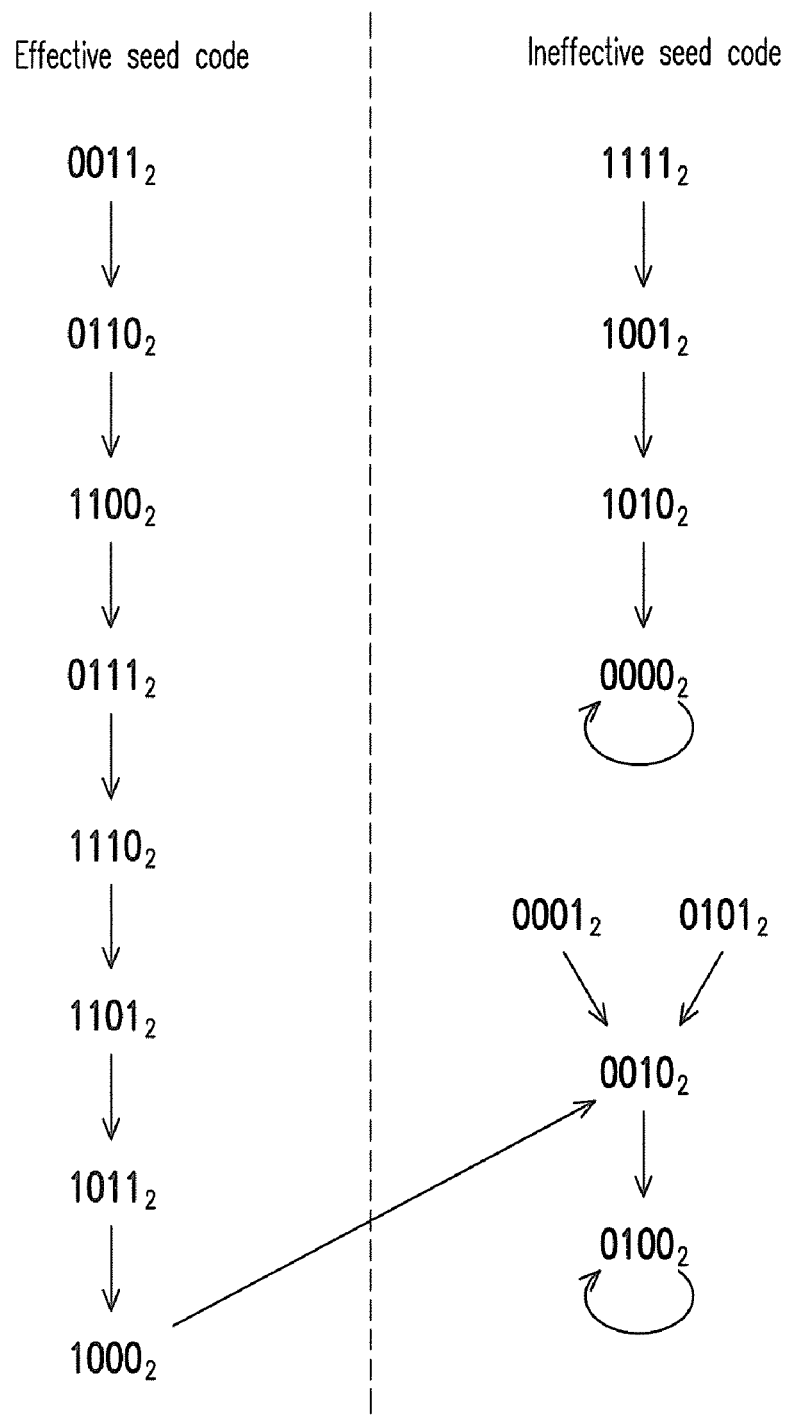
FIG. 9 is a seed code conversion diagram according to the circuit diagram of FIG. 8.

FIG. 8 is a circuit schematic diagram of the ID code generator 121_1 of FIG. 1 according to another exemplary embodiment, i.e. a circuit diagram implemented according to the Karnaugh map of FIG. 7 after simplification. The ID code generator 121_1 can output the first seed code SC1 or the second seed code SC2 to the activation logic unit 122_1 to serve as the first ID code ID1. Implementations of the other ID code generators (for example, 121_2 and 121_n) can also be as that shown in FIG. 8. FIG. 9 is a seed code conversion diagram according to the circuit diagram of FIG. 8, where the ineffective seed codes at the right part of FIG. 9 can all be used as the disable code.

Figure 10:
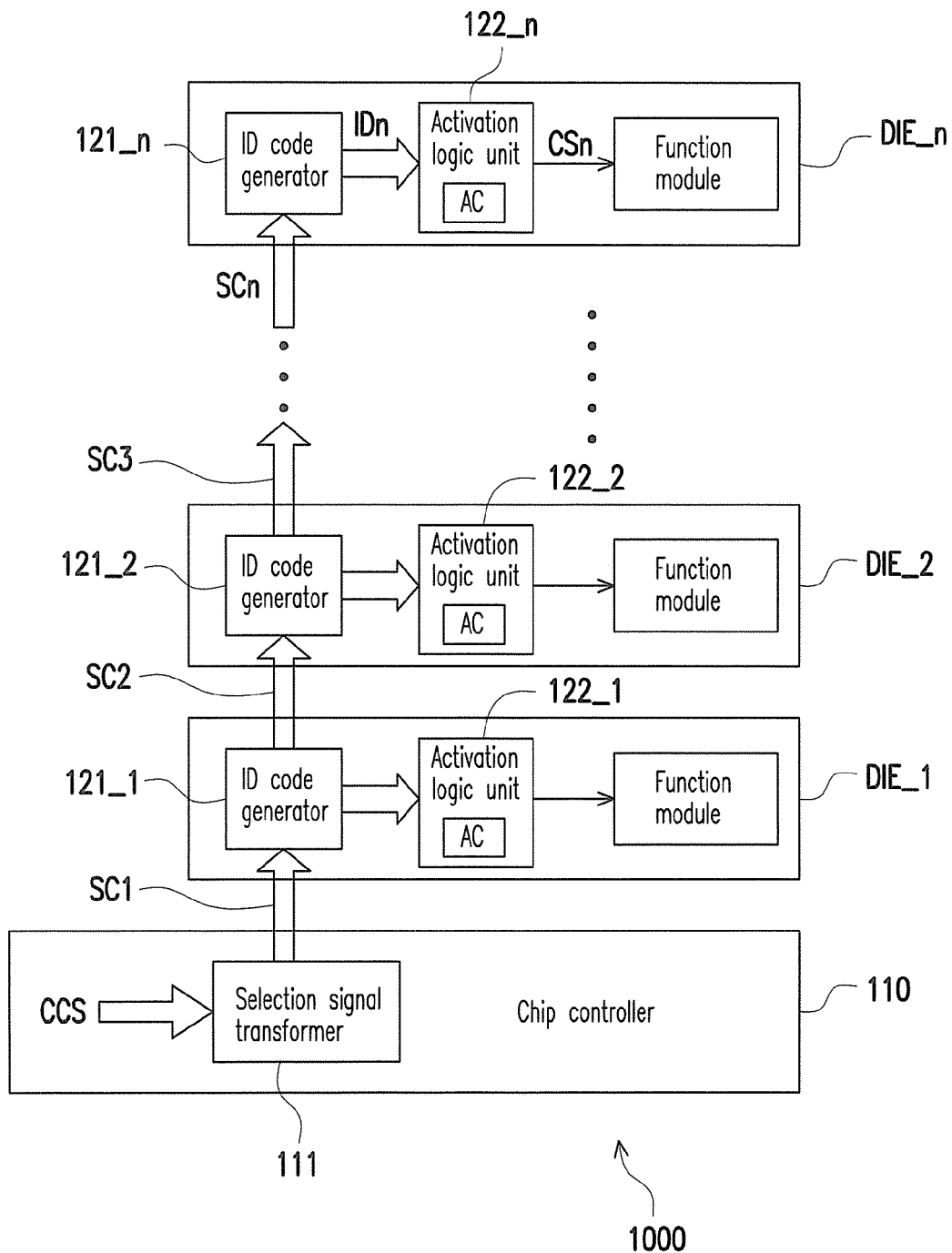
FIG. 10 is a functional block diagram of a multi-chip stacked system according to another exemplary embodiment.

A value range of a conventional chip select signal is a continuous series, for example, $000_2$, $001_2$, $010_2$, ..., $111_2$, though the aforementioned effective seed codes can be discontinuous, so that to be compatible to the conventional chip select method, a selection signal transformer is required to transform the conventional chip select signal into an ID code seed signal. FIG. 10 is a functional block diagram of a multi-chip stacked system 1000 according to another exemplary embodiment. Related descriptions of FIG. 1 to FIG. 9 can be referred for implementation details of the embodiment of FIG. 10. Referring to FIG. 10, the chip controller 110 includes a selection signal transformer 111. The selection signal transformer 111 is electrically connected to the first ID code generator 121_1. The selection signal transformer 111 transforms a chip select signal CCS into the first seed code SC1 for providing to the first ID code generator 121_1.

Figure 11:
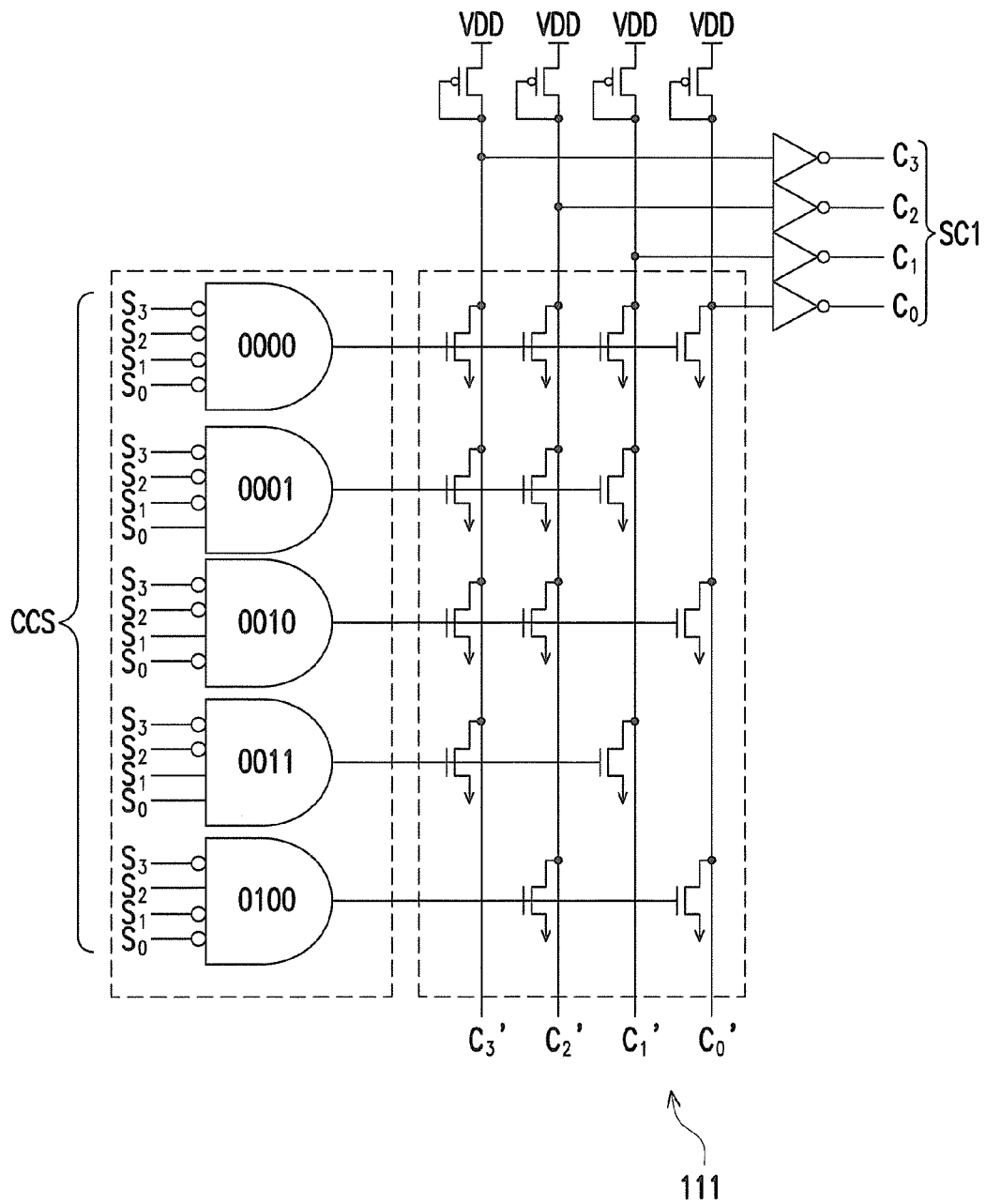
FIG. 11 is a circuit diagram of a selection signal transformer 111 used by the ID code generator 121_1 of FIGS. 3-5.

The selection signal transformer 111 can be implemented by a programmable logic array (PLA). For example, FIG. 11 is a circuit diagram of the selection signal transformer 111 used by the ID code generator 121_1 of FIGS. 3-5. A plurality of enhanced mode P-channel metal-oxide-semiconductors (PMOS) on the top of FIG. 11 may charge a plurality of column signal lines (for example, $c_3'$, $c_2'$, $c_1'$ and $c_0'$ of FIG. 11) of the PLA. N-channel metal-oxide-semiconductors (NMOS) of a NMOS array in the middle of FIG. 11 may discharge the column signal lines. Four input terminals of an AND gate of each row at the left part of FIG. 11 respectively receive bit signals $S_3$, $S_2$, $S_1$ and $S_0$ of the chip select signal CCS. For example, if the chip select signal CCS is "0010", an output of the AND gate of a third row at the left part of FIG. 11 is logic 1, and a logic value of the column signal lines $c_3'$, $c_2'$, $c_1'$ and $c_0'$ is "0010", so that the first seed code SC1 is "1101". For another example, if the chip select signal CCS is "0011", an output of the AND gate of a fourth row at the left part of FIG. 11 is logic 1, and the logic value of the column signal lines $c_3'$, $c_2'$, $c_1'$ and $c_0'$ is "0101", so that the first seed code SC1 is "1010".

Figure 12:
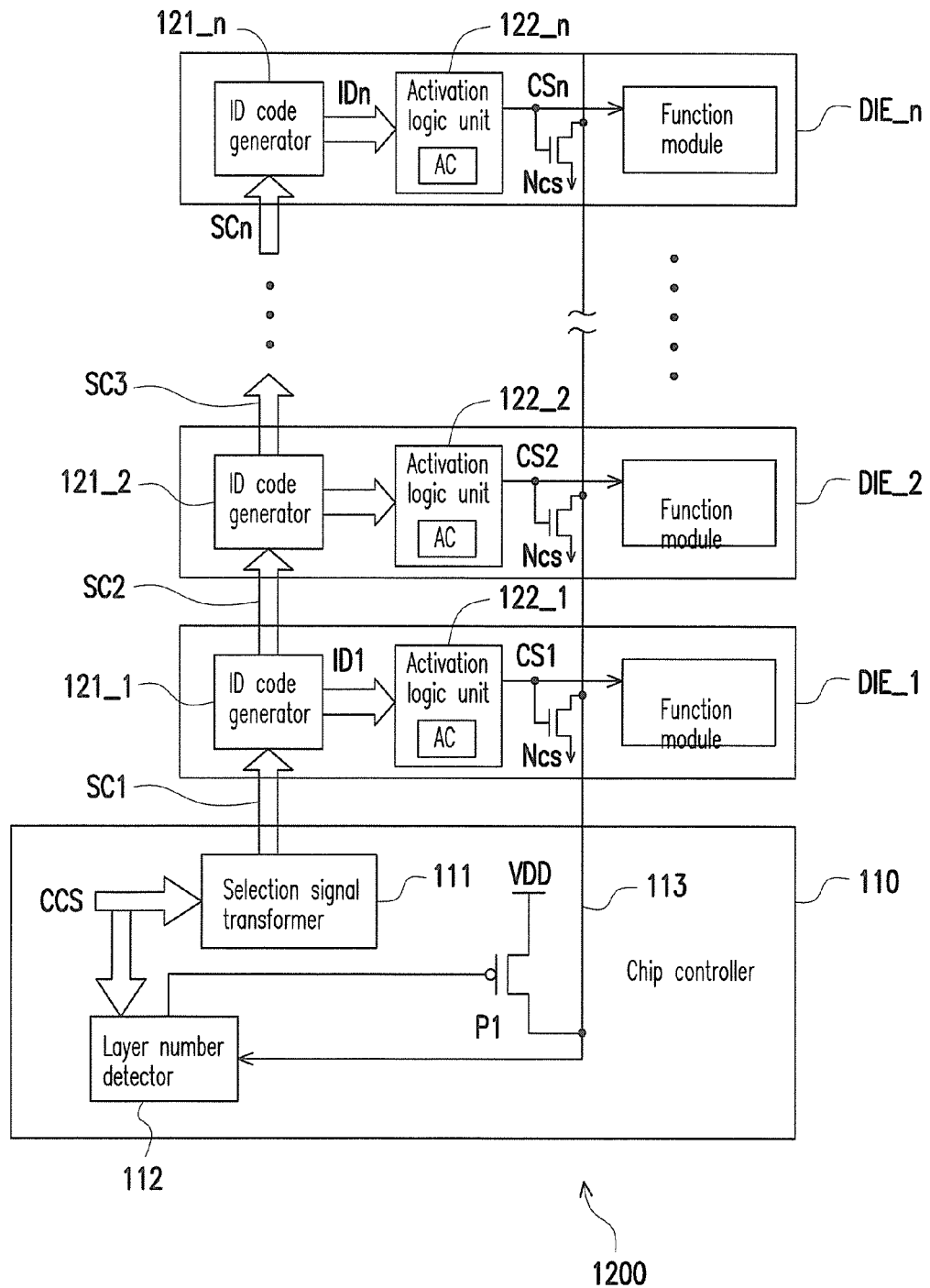
FIG. 12 is a functional block diagram of a multi-chip stacked system according to still another exemplary embodiment.

FIG. 12 is a functional block diagram of a multi-chip stacked system 1200 according to still another exemplary embodiment. Related descriptions of FIG. 1 to FIG. 11 can be referred for implementation details of the embodiment of FIG. 12. Referring to FIG. 12, the chip controller 110 includes a selection signal transformer 111, a layer number detector 112, a signal line 113 and a PMOS transistor P1. The chip controller 110 can automatically detect a number of the stacked layers of the system (a layer number of the chips). The layer number detector 112 has a register for recording a number of the stacked chips. In another embodiment, the layer number detector 112 further records the effective chip select signal CCS. The signal line 113 is connected to a drain of a NMOS transistor $N_{CS}$ of each of the chips DIE_1, DIE_2, ..., DIE_n. When the output of the activation logic unit of a certain chip is logic 1, the NMOS transistor $N_{CS}$ of the chip discharges the signal line 113.

In a normal operation mode, the layer number detector 112 may output logic 1 to turn off the PMOS transistor P1. In an automatic chip number detection mode, the chip controller 110 changes the first seed code SC1 and detects the outputs of the activation logic units 122_1, 122_2, ..., 122_n, and obtains the number of the chips in the multi-chip stacked system 1200 according to a detection result. In detail, the layer number detector 112 controls the PMOS transistor P1 according to a timing of the chip select signal CCS, so as to charge the signal line 113. For example, referring to FIG. 5, FIG. 11 and FIG. 12, it is assumed that the activation code AC of the activation logic units 122_1, 122_2, ..., 122_n is defined as "1111". Before the chip select signal CCS is transited to "0000", the layer number detector 112 first controls the PMOS transistor P1 to charge the signal line 113. When the chip select signal CCS is "0000", the layer number detector 112 turns off the PMOS transistor P1, the first seed code SC1 and the first ID code ID1 are "1111", and the chip select signal CS1 output by the activation logic unit 122_1 is logic 1, so that the function module of the first chip DIE_1 is activated, and the NMOS transistor $N_{CS}$ of the first chip DIE_1 is turned on, so as to discharge the signal line 113. By discharging the signal line 113, the layer number detector 112 can detect that the first die DIE_1 is to be activated when the chip select signal CCS is "0000". Namely, "0000" is an effective chip select signal CCS. Therefore, the layer number detector 112 records the number of the stacked chips as 1, and/or records the effective chip select signal CCS, i.e. "0000". Deduced by analogy until all of logic configurations of the chip select signal CCS has been tested, and then the automatic chip number detection mode is ended to return back to the normal operation mode.

In summary, the same activation code AC can be built in the chips DIE_1-DIE_n of the aforementioned exemplary embodiments. The ID code generators 121_1-121_n of the chips are connected in series. The ID code generator of any stage generates the corresponding ID code according to the output of the ID code generator of the previous stage. The ID codes ID1-IDn output by the ID code generators 121_1-121_n of the chips are different. Therefore, only one of the ID codes ID1-IDn can be complied with the activation code AC at most. When one of the ID codes ID1-IDn is complied with the activation code AC, the corresponding chip is activated. When all of the ID codes ID1-IDn are not complied with the activation code AC, none of the chips is activated.

Therefore, difference treatment of the chips DIE_1-DIE_n of the aforementioned exemplary embodiments is unnecessary, and when the totally identical chips DIE_1-DIE_n are stacked, any of the chips can still be freely selected for activation. Compared to the conventional technique, increasing of the TSV area or usage of a complicated computation circuit is unnecessary, so that cost of the TSV connection stacking technique is reduced.

It will be apparent to those skilled in the art that various modifications and variations can be made to the structure of the disclosure without departing from the scope or spirit of the invention. In view of the foregoing, it is intended that the disclosure cover modifications and variations of this disclosure provided they fall within the scope of the following claims and their equivalents.

What is claimed is:

1. A chip select apparatus, for controlling n stacked chips identical to each other, the chip select apparatus comprising:
   n identification (ID) code generators, having an ID code generator disposed in an $i^{th}$ chip of the chips, wherein n is an integer, and i is an integer between 1 and n, wherein a first ID code generator of the ID code generators receives a first seed code, and generates a first ID code and a second seed code according to the first seed code, and an $i^{th}$ ID code generator is electrically connected to an $(i-1)^{th}$ ID code generator to receive an seed code, and generates an $i^{th}$ ID code and an $(i+1)^{th}$ seed code according to the $i^{th}$ seed code, wherein the first ID code to an $n^{th}$ ID code are different to each other; and
   n activation logic units, each having an activation code, an $i^{th}$ activation logic unit in the activation logic units being disposed in the $i^{th}$ chip of the chips, and the $i^{th}$ activation logic unit being electrically connected to the $i^{th}$ ID code generator for receiving the ID code, wherein the activation logic unit activates the chip when the ID code received by the $i^{th}$ activation logic unit is complied with the activation code,
   wherein the activation codes built in the activation logic units respectively disposed in the n stacked chips are the same code,
   wherein each of the first to the $n^{th}$ ID codes changes as the first seed code changes, such that one of the n stacked chips is selected and activated in response to the first seed code and the same activation codes.

2. The chip select apparatus as claimed in claim 1, wherein the activation logic units have the same circuit structure.

3. The chip select apparatus as claimed in claim 1, wherein when i is less than n, the $i^{th}$ ID code generator outputs the $i^{th}$ ID code to an $(i+1^{th}$ ID code generator to serve as the $(i+1)^{th}$ seed code.

4. The chip select apparatus as claimed in claim 3, wherein the $i^{th}$ ID code is an $(i+1)^{th}$ value and the $(i+1)^{th}$ ID code is an $(i+2)^{th}$ value when the $i^{th}$ seed code is an $i^{th}$ value; the $i^{th}$ ID code is the $(i+2)^{th}$ value and the $(i+1)^{th}$ ID code is an $(i+3)^{th}$ value when the $i^{th}$ seed code is the $(i+1)^{th}$ value; and the $i^{th}$ ID code is the $(i+3)^{th}$ value and the $(i+1)^{th}$ ID code is an $(i+4)^{th}$ value when the $i^{th}$ seed code is the $(i+2)^{th}$ value.

5. The chip select apparatus as claimed in claim 4, wherein the activation code is the $(n+1)^{th}$ value or the $(n+2)^{th}$ value.

6. The chip select apparatus as claimed in claim 1, wherein the $i^{th}$ ID code generator outputs the $i^{th}$ seed code to the $i^{th}$ activation logic unit to serve as the $i^{th}$ ID code, and generates the $(i+1)^{th}$ seed code to an $(i+1)^{th}$ ID code generator according to the $i^{th}$ seed code when i is less than n.

7. The chip select apparatus as claimed in claim 6, wherein the $i^{th}$ ID code is an $i^{th}$ value and the $(i+1)$ ID code is an $(i+1)^{th}$ value when the $i^{th}$ seed code is the $i^{th}$ value; the $i^{th}$ ID code is the $(i+1)^{th}$ value and the $(i+1)^{th}$ ID code is an $(i+2)^{th}$ value when the $i^{th}$ seed code is the $(i+1)^{th}$ value; and the $i^{th}$ ID code is the $(i+2)^{th}$ value and the $(i+1)^{th}$ ID code is an $(i+3)^{th}$ value when the $i^{th}$ seed code is the $(i+2)^{th}$ value.

8. The chip select apparatus as claimed in claim 7, wherein the activation code is the $n^{th}$ value or the $(n+1)^{th}$ value.

9. The chip select apparatus as claimed in claim 1, wherein the ID code Generators have the same circuit structure.

10. The chip select apparatus as claimed in claim 1, wherein the ID code generators are cyclic code generators, and the cyclic code generator comprises exclusive-OR gates and routing shift.

11. The chip select apparatus as claimed in claim 1, wherein the ID code generators are logic circuits.

12. The chip select apparatus as claimed in claim 1, further comprising:
a selection signal transformer, electrically connected to the first ID code generator in the ID code generators, for transforming a chip select signal into the first seed code for providing to the first ID code generator.

13. The chip select apparatus as claimed in claim 12, wherein the selection signal transformer is a programmable logic array.

14. A multi-chip stacked system, comprising:
n chips identical to each other, wherein n is an integer;
n identification (ID) code generators, having an $i^{th}$ ID code generator disposed in an $i^{th}$ chip of the chips, wherein i is an integer between 1 and n, wherein a first ID code generator of the ID code generators receives a first seed code, and generates a first ID code and a second seed code according to the first seed code, and an $i^{th}$ ID code generator is electrically connected to an $(i-1)^{th}$ ID code generator to receive an $i^{th}$ seed code, and generates an $i^{th}$ ID code and an $(i+1)^{th}$ seed code according to the $i^{th}$ seed code, wherein the first ID code to an $n^{th}$ ID code are different to each other;
n activation logic units, each having an activation code, an $i^{th}$ activation logic unit in the activation logic units being disposed in the $i^{th}$ chip of the chips, and the activation logic unit being electrically connected to the $i^{th}$ ID code generator for receiving the $i^{th}$ ID code, wherein the $i^{th}$ activation logic unit activates the $i^{th}$ chip when the $i^{th}$ ID code received by the $i^{th}$ activation logic unit is complied with the activation code; and
a chip controller, electrically connected to the first ID code generator in the ID code generators, for supplying the first seed code;
wherein the activation codes built in the activation logic units respectively disposed in the n stacked chips are the same code,
wherein each of the first to the $n^{th}$ ID codes changes as the first seed code changes, such that one of the n stacked chips is selected and activated in response to the first seed code and the same activation codes.

15. The multi-chip stacked system as claimed in claim 14, wherein in an automatic chip number detection mode, the chip controller changes the first seed code and detects outputs of the activation logic units, and obtains a number n of the chips according to a detection result.

16. The multi-chip stacked system as claimed in claim 14, wherein the activation logic units have the same circuit structure.

17. The multi-chip stacked system as claimed in claim 14, wherein when i is less than n, the $i^{th}$ ID code generator outputs the ID code to an $(i+1)^{th}$ ID code generator to serve as the $(i+1)^{th}$ seed code.

18. The multi-chip stacked system as claimed in claim 17, wherein the $i^{th}$ ID code is an $(i+1)^{th}$ value and the $(i+i^{th}1)^{th}$ ID code is an $(i+2)^{th}$ value when the seed code is an $i^{th}$ value; the $i^{th}$ ID code is the $(i+2)^{th}$ value and the $(i+1)^{th}$ ID code is an $(i+3)^{th}$ value when the $i^{th}$ seed code is the $(i+1)^{th}$ value; and the $i^{th}$ ID code is the $(i+3)^{th}$ value and the $(i+1)^{th}$ ID code is an $(i+4)^{th}$ value when the $i^{th}$ seed code is the $(i+2)^{th}$ value.

19. The multi-chip stacked system as claimed in claim 18, wherein the activation code is the $(n+1)^{th}$ value or the $(n+2)^{th}$ value.

20. The multi-chip stacked system as claimed in claim 14, wherein the $i^{th}$ ID code generator outputs the i seed code to the $i^{th}$ activation logic unit to serve as the $i^{th}$ ID code, and generates the $(i+1)$ seed code to an $(i+1)^{th}$ ID code generator according to the $i^{th}$ seed code when i is less than n.

21. The multi-chip stacked system as claimed in claim 20, wherein the $i^{th}$ ID code is an $i^{th}$ value and the $(i+1)^{th}$ ID code is an $(i+1)^{th}$ value when the $i^{th}$ seed code is the $i^{th}$ value; the $i^{th}$ ID code is the $(i+1)^{th}$ value and the $(i+1)^{th}$ ID code is an $(i+2)^{th}$ value when the $i^{th}$ seed code is the $(i+1)^{th}$ value; and the $i^{th}$ ID code is the $(i+2)^{th}$ value and the $(i+1)^{th}$ ID code is an $(i+3)^{th}$ value when the $i^{th}$ seed code is the $(i+2)^{th}$ value.

22. The multi-chip stacked system as claimed in claim 14, wherein the activation code is the $n^{th}$ value or the $(n+1)^{th}$ value.

23. The multi-chip stacked system as claimed in claim 14, wherein the ID code generators have the same circuit structure.

24. The multi-chip stacked system as claimed in claim 14, wherein the ID code generators are cyclic code generators, and the cyclic code generator comprises exclusive-OR gates and routing shift.

25. The multi-chip stacked system as claimed in claim 14, wherein the ID code generators are logic circuits.

26. The multi-chip stacked system as claimed in claim 14, further comprising:
a selection signal transformer, electrically connected to the first ID code generator in the ID code generators, for transforming a chip select signal into the first seed code for providing to the first ID code generator.

27. The multi-chip stacked system as claimed in claim 26, wherein the selection signal transformer is a programmable logic array.

* * * * *